United States Patent [19]

Dwinell

[11] 4,161,661
[45] Jul. 17, 1979

[54] SYSTEM FOR AUTOMATICALLY SWITCHING TRANSFORMER COUPLED LINES

[76] Inventors: Robert A. Frosch, Administrator of the National Aeronautics and Space Administration, with respect to an invention of William S. Dwinell, Santa Ana, Calif.

[21] Appl. No.: 885,067

[22] Filed: Mar. 9, 1978

[51] Int. Cl.² .............................................. H01H 3/16
[52] U.S. Cl. ...................................... 307/119; 307/98; 361/170
[58] Field of Search ................. 307/112, 113, 98, 125, 307/140, 119; 340/652, 538; 361/156, 170, 194

[56] References Cited
U.S. PATENT DOCUMENTS 3,160,795  12/1964  Aune ..................................... 361/156

Primary Examiner—L. T. Hix
Assistant Examiner—S. D. Schreyer
Attorney, Agent, or Firm—Marvin J. Marnock; John R. Manning; Marvin F. Matthews

[57] ABSTRACT

A system is provided for automatically controlling transformer coupled alternating-current electric lines. The secondary winding of each transformer is provided with a center tap. A switching circuit is connected to the center taps of a pair of secondary windings and includes a switch controller. An impedance is connected between the center taps of the opposite pair of secondary windings. The switching circuit has continuity when the AC lines are continuous and discontinuity with any disconnect of the AC lines. Normally-open switching means are provided in at least one AC line. The switch controller automatically opens the switching means when the AC lines become separated.

6 Claims, 2 Drawing Figures

SYSTEM FOR AUTOMATICALLY SWITCHING TRANSFORMER COUPLED LINES

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 45 U.S.C. 2457).

BACKGROUND OF THE INVENTION (a) Field of the Invention

This invention relates to systems for switching transformer coupled AC lines and has particular application to space vehicles wherein an umbilical connector couples the audio lines from the launch station to the audio lines in the space vehicle.

(b) Description of the Prior Art

While this invention can have application to various technical fields, wherein AC lines are transformer coupled, it will be illustrated in connection with audio communication lines in space vehicles. Prior to launch, audio lines at the launch station are coupled to audio lines in the space vehicle through an umbilical connector. These audio lines at the launch station are typically transformer coupled to the audio lines in the space vehicle for better noise isolation.

An indepedent switching circuit, whose energization is controlled by a manually operated switch at the control panel of the space vehicle, energizes a switch controller which operates switching means in the audio lines of the space vehicle to connect them to the transformers. Following launch, the switching circuit is manually de-energized to cause the switching means to disconnect the audio lines from the transformers in the space vehicle.

It will be appreciated that immediately following launch, the crew in the space vehicle has numerous operative functions to carry out and, therefore, the need to manually operate a control switch at the control panel for de-energizing the switching circuit constitutes a burden for the crew which this invention intends to remove. The invention also simplifies the space vehicle by eliminating the need for the switch and extra wires leading from the manually operated switch at the space vehicle's control panel to the switching circuit.

SUMMARY OF THE INVENTION

The automatic switching system of this invention is adapted for a network having transformer-coupled AC lines interconnected through a mating connector. Each AC line is connected to the connector through the transformer having a primary winding and a center-tapped secondary winding. An independent switching circuit is connected to the center taps of a pair of secondary windings connected to one side of the connector. An interconnect is made to the center-taps of the opposite pair of secondary windings connected to the other side of the connector. The switching circuit has continuity through the interconnect when the connector is mated, and it has discontinuity when the connector is unmated. The switching means are controlled by a switch controller forming part of the switching circuit. The switching means automatically turn ON or OFF depending only on the continuity or discontinuity in the switching circuit. This continuity is interrupted when the connector separates following, for example, the launching of the space vehicle.

DETAILED DESCRIPTION OF A PREFERRED EMBODIMENT

Figure 1:
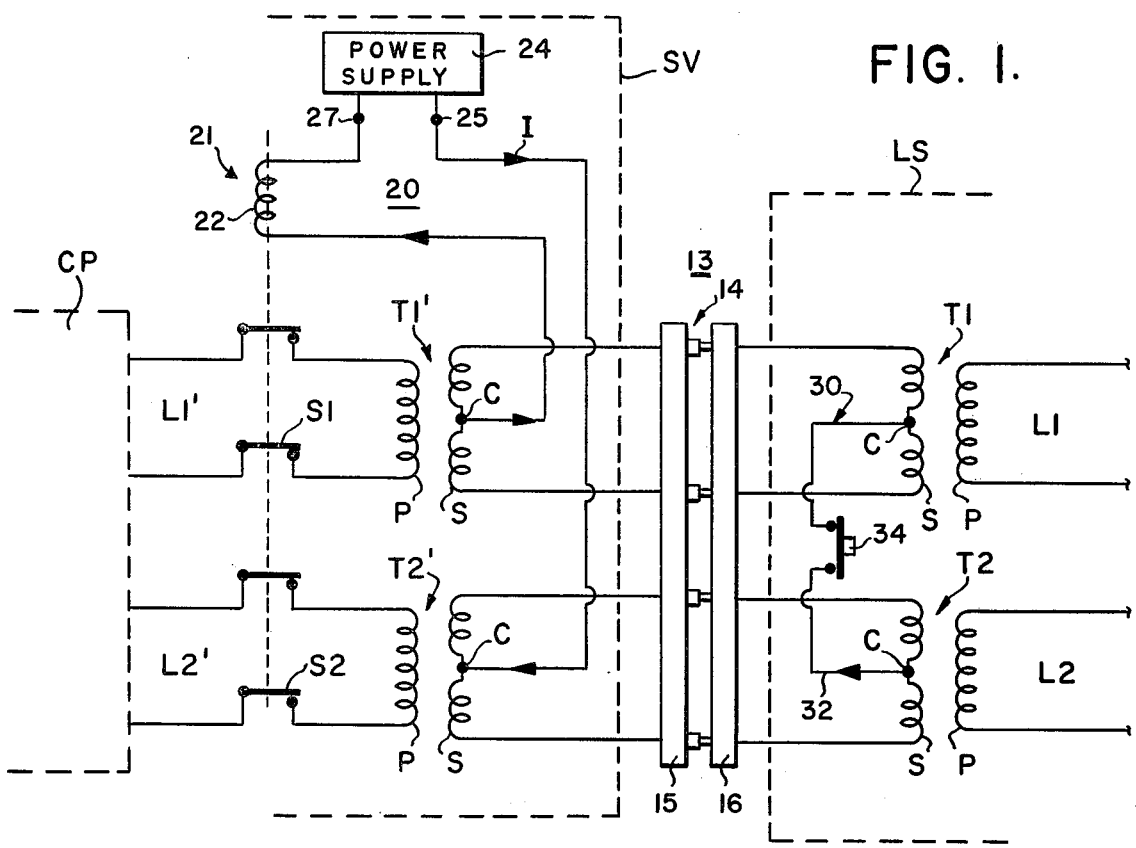
FIG. 1 is a schematic representation of a preferred system for automatically switching transformer-coupled AC lines in accordance with the invention.

As previously mentioned, the invention will be illustrated in connection with audio lines used for carrying out communications between a launch station LS and a space vehicle SV which are interconnected through an umbilical cord 13 having an umbilical connector 14 comprised of two plugs 15 and 16. The equipment in the space vehicle has a control panel CP.

The audio lines L1–L2 and L1'–L2' are coupled through the umbilical cord. For purposes of isolation, the audio lines L1–L2 and L1'–L2' are coupled through transformers T1–T2 and T1'–T2', respectively. The prime (') designates that the particular item is on the side of the space vehicle. Each transformer has a primary winding P and a secondary winding S.

Lines L1'–L2' are provided with at least one but preferably two normally-open switching means S1–S2, respectively, for the purpose of disconnecting the lines from the transformers T1'–T2' after the plugs 15 and 16 separate at the launch of the vehicle.

In accordance with the present invention, it is desired that the switching means S1–S2 become operative automatically immediately following the uncoupling of the two plugs 15, 16. In this manner no switch need be manually moved on the control panel CP for the purpose of operating switches S1–S2.

This is accomplished in accordance with the present invention by providing each secondary winding S with a center tap C establishing a null point for the secondary winding. The center taps of transformers T1' and T2' are connected to a switching circuit, generally designated as 20. For simplicity of description, the switching circuit 20 is illustrated as comprising a switch controller 21, such as a relay coil 22, which when energized turns the switches S1–S2 ON.

In most applications, the switches S1–S2 and the switch controller 21 will be solid state devices. The switching circuit 20 is energized by a power supply 24 which can be DC or AC.

At the launching station LS, the center taps of transformers T1 and T2 are interconnected by a low impedance circuit, generally designated as 30, which can comprise a conductor 32 and a manually-operated test switch 34 which is normally closed. Impedance 30 provides an electric path, i.e., continuity for the switching circuit 20 when plugs 15 and 16 of the umbilical connector 14 are mated, as shown in FIG. 1. Thus, the supply current I flows from one terminal 25 of the power supply 24 in the direction of the arrows, into the center tap of transformer T2' and will flow out from the center tap of transformer T2, thence through the impedance 30 into the center tap of transformer T1. The current will flow out from the center tap of transformer T1' and will return through the relay 22 to the other terminal 27 of the power supply 24.

It will be appreciated that since null points exist at the transformers' center taps C, the current I will divide equally and will flow in opposite directions in the secondary windings so that it will not interfere with the audio communications carried by the audio lines L1–L2 and L1'–L2'.

Figure 2:
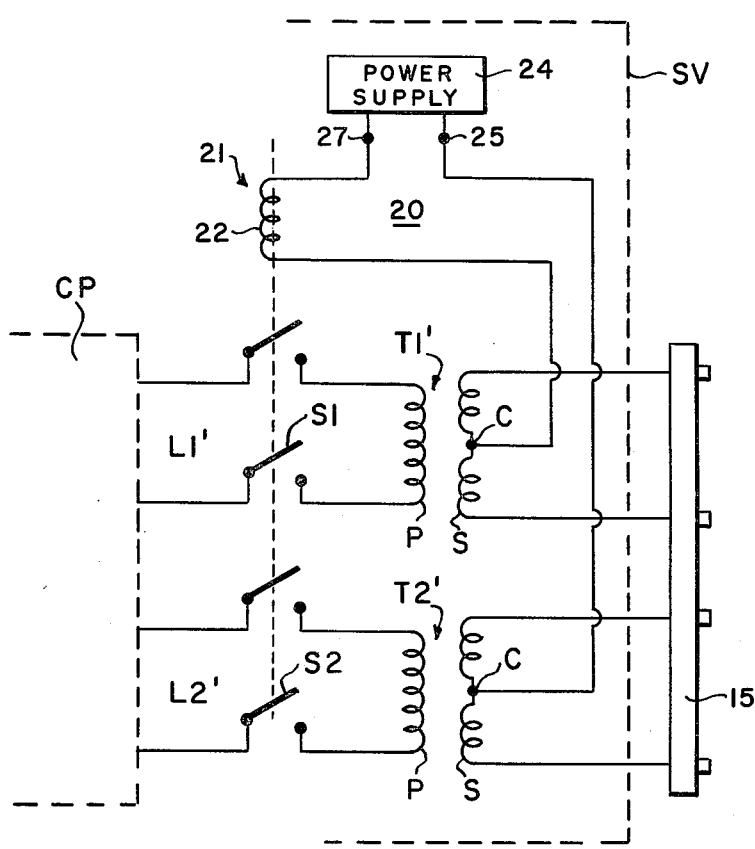
FIG. 2 shows the portion of the system in the space vehicle following launch.

Upon launch the two plugs 15 and 16 of the umbilical connector 14 become disconnected (FIG. 2), thereby automatically establishing a discontinuity in the switching circuit 20 by isolating impedance 30 therefrom, which has the effect of de-energizing the relay coil 22 and allowing the switching means S1–S2 to open. In this manner, the audio lines L1'–L2' in the space vehicle will become disconnected from the unused transformers T1'–T2' and associated vehicle wiring which might otherwise interfere with the audio communications within the space craft.

The operation of the switching means S1–S2 can be tested with the manually operated test switch 34. Thus when switch 34 is opened, the switching circuit 20 will have a discontinuity which simulates a vehicle launch.

It will be appreciated by those skilled in the art that in accordance with this invention no manually operated switch need be operated at the control panel CP of the spacecraft in order to de-energize relay coil 22.

The present invention can be used in monitoring various conditions which are equivalent to the uncoupling of the connector plugs 15 and 16. The change in the operative condition of the switching means S1–S2 can cause, for example, an alarm. The invention therefore can have general utility for monitoring events.

What is claimed is:

1. A system for automatically operating switching means in transformer-coupled AC lines interconnected by a two-plug connector, comprising:
    four transformers, each transformer having a primary winding and a center-tapped secondary winding;
    a switching circuit connected to the center taps of the secondary windings of a first and second transformer,
    the secondary windings of the first and second transformers being connected to one plug of the connector,
    the secondary windings of the third and fourth transformers being connected to the other plug of the connector;
    an electric line connected to each primary winding, a switching means in the lines connected to the first and second transformers,
    said switching circuit including a switch controller for operating the switching means;
    an impedance connected between the center taps of the secondary windings of the third and fourth transformers,
    said switching circuit having continuity through said impedance whereby said switch controller maintains said switching means in one state when said connector plugs are mated, and
    said switching circuit having discontinuity through said impedance whereby said controller maintains said switching means in another state when said plugs are unmated.

2. The system of claim 1 wherein said impedance includes a conductor.

3. The system of claim 2 wherein said impedance includes a switch for testing said switching circuit.

4. The system of claim 2 wherein said controller is a relay.

5. A system for automatically switching at least one line in a network including four lines,
    a switching means having a normal state adapted for coupling the first line in the primary winding of a first transformer having a center-tapped secondary winding,
    a second line coupled to the primary winding of a second transformer having a center-tapped secondary winding,
    a third line coupled to the primary winding of a third transformer having a center-tapped secondary winding,
    a fourth line coupled to the primary winding of a fourth transformer having a center-tapped secondary winding;
    a switch circuit connected to the center taps of the secondary windings of the first and second transformers;
    an impedance interconnecting the center taps of the secondary windings of the third and fourth transformers,
    a two-plug connector interconnecting the secondary windings of the first, second, third and fourth transformers whereby said first line is coupled through said first and third transformers to said third line and said second line is coupled through said second and fourth transformers to said fourth line,
    said switching circuit including a switch controller for operating said switching means when the controller is energized,
    said switching circuit having circuit continuity through said impedance and the secondary windings of said four transformers thereby allowing the switch controller to operate the switching means when said two plugs of the connector are mated, and
    said switching circuit having discontinuity when the two plugs are unmated thereby deenergizing said switching circuit and said switch controller and returning said switching means to its normal state.

6. A system for automatically operating switch means in transformer-coupled AC lines interconnected by a two-plug connector, comprising:
    a first plurality of transformers, each transformer having a primary winding and a center-tapped secondary winding, the secondary windings of said first plurality of transformers being connected to one plug of the connector,
    a second plurality of transformers, each having a primary winding and a center-tapped secondary winding,
    the secondary windings of said second plurality of transformers being connected to the other plug of the connector and a different one of said AC lines being connected to each primary winding of said transformers; switch means in each of said lines connected to the primary windings of the first plurality of transformers;
    impedance means connected between the center taps of the secondary windings of said second plurality of transformers;
    a switching circuit means connected to the center taps of the secondary windings of said first plurality of transformers and having continuity through said plug connector and said impedance means when said connector plugs are mated, said switching circuit means being adapted to operate said switch means and maintain said switch means in closed condition when energized;

a power supply means for energizing said switching circuit means, said switching circuit means having a discontinuity when said plugs are unmated whereby said switching circuit means is deenergized and opens said switch means and the electric lines connected to the primary windings of said first plurality of transformers.

* * * * *